United States Patent
Kim et al.

(10) Patent No.: US 9,391,058 B2
(45) Date of Patent: Jul. 12, 2016

(54) TRANSIENT VOLTAGE SUPPRESSOR AND ITS MANUFACTURING METHOD

(71) Applicant: KEC Corporation, Seoul (KR)

(72) Inventors: Hyun Sik Kim, Gyeongsangbuk-do (KR); Hee Won Jang, Gyeongsangbuk-do (KR)

(73) Assignee: KEC Corporation, Seoul (KR)

( * ) Notice: Subject to any disclaimer, the term of this patent is extended or adjusted under 35 U.S.C. 154(b) by 15 days.

(21) Appl. No.: 14/503,622

(22) Filed: Oct. 1, 2014

(65) Prior Publication Data

US 2015/0115390 A1    Apr. 30, 2015

(30) Foreign Application Priority Data

Oct. 31, 2013   (KR) ................ 10-2013-0131808

(51) Int. Cl.
 *H01L 29/861* (2006.01)
 *H01L 27/02* (2006.01)

(52) U.S. Cl.
 CPC ........ *H01L 27/0248* (2013.01); *H01L 27/0255* (2013.01); *H01L 29/861* (2013.01)

(58) Field of Classification Search
 CPC .............. H01L 23/60; H01L 27/0248; H01L 2224/8111; H01L 2924/30205
 USPC .................................. 257/170, 173, 487, 494
 See application file for complete search history.

(56) References Cited

U.S. PATENT DOCUMENTS

| | | | | |
|---|---|---|---|---|
| 6,075,276 A * | 6/2000 | Kitamura | ............ | H01L 27/0255 257/199 |
| 6,515,345 B2 * | 2/2003 | Robb | .................... | H01L 21/761 257/105 |
| 6,768,228 B1 * | 7/2004 | Fial | .......................... | H02H 5/12 307/131 |
| 7,538,395 B2 * | 5/2009 | Keena | ................. | H01L 27/0255 257/101 |
| 7,579,632 B2 * | 8/2009 | Salih | ....................... | H01L 23/60 257/173 |
| 7,812,367 B2 * | 10/2010 | Salih | ................... | H01L 27/0255 257/106 |
| 7,932,133 B2 * | 4/2011 | Cogan | ................... | H01L 29/866 257/E21.35 |
| 8,089,095 B2 * | 1/2012 | Salih | ................... | H01L 27/0255 257/106 |
| 8,093,133 B2 * | 1/2012 | Saucedo-Flores | .... | H01L 29/747 257/105 |
| 8,110,448 B2 * | 2/2012 | Salih | ................... | H01L 27/0255 257/173 |

(Continued)

FOREIGN PATENT DOCUMENTS

JP   2012-119424   6/2012
JP   2012-182381   9/2012

(Continued)

*Primary Examiner* — Earl Taylor

(57) ABSTRACT

A transient voltage suppressor and its manufacturing method are provided, which can easily control voltage withstanding characteristics of a Zener diode by analogizing growth of a buried layer by forming a portion of the buried layer by performing ion implantation on a first epitaxial layer and then forming the other portion of the buried layer while depositing a second epitaxial layer having the same impurity concentration with the first epitaxial layer, and which can improve a current distribution characteristic by forming a doping region in a ring shape to increase a current pass region by increasing a PN junction area of a Zener diode in a small area.

20 Claims, 6 Drawing Sheets

(56) References Cited

U.S. PATENT DOCUMENTS

| | | | | |
|---|---|---|---|---|
| 8,236,625 B2* | 8/2012 | Salih | H01L 27/0255 | 148/DIG. 174 |
| 8,339,758 B2* | 12/2012 | Liu | H01L 27/0262 | 257/105 |
| 8,431,959 B2* | 4/2013 | Davis | H01L 27/0255 | 257/173 |
| 8,445,917 B2* | 5/2013 | Haney | H01L 29/1608 | 257/481 |
| 8,723,264 B2* | 5/2014 | Marreiro | H01L 27/0255 | 257/355 |
| 2002/0113293 A1* | 8/2002 | Robb | H01L 21/761 | 257/551 |
| 2005/0189602 A1* | 9/2005 | Yamamoto | H01L 21/761 | 257/494 |
| 2005/0275065 A1* | 12/2005 | Cogan | H01L 29/866 | 257/603 |
| 2007/0166942 A1* | 7/2007 | Cogan | H01L 29/866 | 438/380 |
| 2009/0079001 A1* | 3/2009 | Salih | H01L 23/60 | 257/355 |
| 2009/0079022 A1* | 3/2009 | Keena | H01L 27/0255 | 257/494 |
| 2009/0079032 A1* | 3/2009 | Marreiro | H01L 27/0814 | 257/597 |
| 2009/0162988 A1* | 6/2009 | Keena | H01L 27/0255 | 438/400 |
| 2010/0060349 A1* | 3/2010 | Etter | H01L 27/0255 | 327/552 |
| 2010/0090306 A1* | 4/2010 | Salih | H01L 27/0255 | 257/491 |
| 2010/0311211 A1* | 12/2010 | Salih | H01L 27/0255 | 438/140 |
| 2010/0314660 A1* | 12/2010 | Salih | H01L 27/0255 | 257/173 |
| 2012/0064675 A1* | 3/2012 | Salih | H01L 27/0255 | 438/140 |
| 2012/0091504 A1* | 4/2012 | Davis | H01L 27/0255 | 257/146 |
| 2014/0159108 A1* | 6/2014 | Marreiro | H01L 27/0262 | 257/140 |
| 2015/0115390 A1* | 4/2015 | Kim | H01L 27/0248 | 257/487 |

FOREIGN PATENT DOCUMENTS

| | | |
|---|---|---|
| KR | 10-2009-0031290 | 3/2009 |
| KR | 10-2009-0047073 | 5/2009 |

* cited by examiner

< Prior Art >

TRANSIENT VOLTAGE SUPPRESSOR AND ITS MANUFACTURING METHOD

CROSS-REFERENCE TO RELATED APPLICATION

This application claims priority to and the benefit of Korean Patent Application No. 10-2013-0131808 filed on Oct. 31, 2013, which is herein incorporated by reference in its entirety.

BACKGROUND OF THE INVENTION

1. Field of the Invention

Aspects of the present invention relate to a transient voltage suppressor and its manufacturing method.

2. Description of the Related Art

Referring to FIG. 1, a circuit view for the operating principle of a general transient voltage suppressor is illustrated. As illustrated in FIG. 1, the general transient voltage suppressor (TVS) (e.g., a varistor, a thyristor, or a diode (rectifier/Zener)) is connected in parallel between a power supply VG and a load RLOAD, and one side of the transient voltage suppressor TVS is connected to a ground (GND).

With this configuration, when an over-voltage exceeding a voltage required by the load RLOAD is input, a transient voltage derived current (ITV) flows toward the ground GND through the transient voltage suppressor TVS and only a low voltage that is clamped and stabilized is applied to the load RLOAD, thereby safely protecting the load RLOAD from the transient voltage.

The transient voltage suppressor TVS is affected by capacitance and electrostatic discharge (ESD). In order to increase an ESD characteristic of the transient voltage suppressor TVS, which is generally comprised of a single element, it is necessary to increase an area of the transient voltage suppressor TVS. However, when the area of the transient voltage suppressor TVS is increased, a contact area of a substrate and a doping region may be increased and a capacitance value may be increased accordingly. The increase in the capacitance value of the transient voltage suppressor TVS may severely distort signals, making it difficult to adopt the transient voltage suppressor TVS to a high-frequency circuit. In addition, since a breakdown voltage of the transient voltage suppressor TVS is considerably affected by a concentration difference between the substrate and the doping region, affecting the overall current flowing throughout the transient voltage suppressor TVS. Accordingly, internal resistance of the transient voltage suppressor TVS may be increased, thereby reducing an electrostatic withstand voltage.

SUMMARY OF THE INVENTION

Aspects of the present invention provide a transient voltage suppressor and its manufacturing method, which can easily control voltage withstanding characteristics of a Zener diode by analogizing growth of a buried layer by forming a portion of the buried layer by performing ion implantation on a first epitaxial layer and then forming the other portion of the buried layer while depositing a second epitaxial layer having the same impurity concentration with the first epitaxial layer.

Other aspects of the present invention provide a transient voltage suppressor and its manufacturing method, which can improve a current distribution characteristic by forming a doping region in a ring shape to increase a current pass region by increasing a PN junction area of a Zener diode in a small area.

In accordance with one aspect of the present invention, there is provided a transient voltage suppressor including a substrate of a first conductivity type, a first epitaxial layer of a first conductivity type, formed on a first surface of the first conductivity type substrate, a second epitaxial layer of a first conductivity type, formed on a first surface of the first conductivity type first epitaxial layer, a buried layer of a second conductivity type, interposed between the first conductivity type first epitaxial layer and the first conductivity type second epitaxial layer, a doping region of a first conductivity type, inwardly formed from a first surface of the first conductivity type second epitaxial layer, a doping region of a second conductivity type, inwardly formed from the first surface of the first conductivity type second epitaxial layer and spaced apart from the first conductivity type doping region, and a first electrode formed to cover a first surface of the first conductivity type doping region and a first surface of the second conductivity type doping region and electrically connecting the first conductivity type doping region and the second conductivity type doping region. The first conductivity type first epitaxial layer and the first conductivity type second epitaxial layer have lower concentrations than the first conductivity type substrate.

The first conductivity type first epitaxial layer and the first conductivity type second epitaxial layer may have the same metal doping concentration.

The second conductivity type buried layer may be inwardly formed in the first conductivity type first epitaxial layer and the first conductivity type second epitaxial layer from a second surface of the first conductivity type second epitaxial layer in contact with the first surface of the first conductivity type first epitaxial layer.

The second conductivity type buried layer may be formed between the first conductivity type first epitaxial layer and the first conductivity type second epitaxial layer to be spaced apart from the first conductivity type doping region in a depth direction of the first conductivity type second epitaxial layer.

The transient voltage suppressor may further include a second electrode formed to cover a second surface of the first conductivity type substrate.

The transient voltage suppressor may further include an insulation layer interposed between the first electrode and the first surface of the first conductivity type second epitaxial layer.

The first conductivity type may be an N type and the second conductivity type may be a P type.

In accordance with another aspect of the present invention, there is provided a manufacturing method of a transient voltage suppressor, the manufacturing method including preparing a substrate of a first conductivity type, forming a first epitaxial layer of a first conductivity type on a first surface of the first conductivity type substrate, implanting an impurity of a second conductivity type into a portion of a first surface of the first conductivity type first epitaxial layer and then forming a second epitaxial layer of a first conductivity type by allowing a buried layer of a second conductivity type to grow by the second conductivity type impurity while allowing the first conductivity type second epitaxial layer to grow from the first surface of the first conductivity type first epitaxial layer, inwardly forming a doping region of a first conductivity type from the first surface of the first conductivity type second epitaxial layer to the second conductivity type buried layer, inwardly forming a doping region of a second conductivity type from the first surface of the first conductivity type second epitaxial layer to be spaced apart from the first conductivity type doping region, forming an insulation layer on the first surface of the first conductivity type second epitaxial layer to expose the first conductivity type doping region and the second conductivity type doping region, and forming a first electrode by forming a metal layer to cover the exposed first conductivity type doping region and the exposed the second conductivity type doping region.

The first conductivity type first epitaxial layer and the first conductivity type second epitaxial layer may have the same metal doping concentration.

In accordance with still another aspect of the present invention, there is provided a transient voltage suppressor including a substrate of a first conductivity type, an epitaxial layer of a first conductivity type, formed on a first surface of the first conductivity type substrate, a first doping region of a second conductivity type, inwardly formed from a first surface of first conductivity type epitaxial layer, a first doping region of a first conductivity type, inwardly formed from the first surface of the first conductivity type epitaxial layer to be spaced apart from the second conductivity type first doping region and to be shaped of a ring surrounding the second conductivity type first doping region, a second doping region of a first conductivity type, inwardly formed from a first surface of the second conductivity type first doping region to the second conductivity type first doping region, a second doping region of a second conductivity type, inwardly formed from the first surface of the first conductivity type epitaxial layer to be spaced apart from the first conductivity type first doping region, a third doping region of a second conductivity type, inwardly formed from the first surface of the first conductivity type epitaxial layer, the first surface of the first conductivity type first doping region and the second conductivity type first doping region and connecting the second conductivity type first doping region and the first conductivity type first doping region, and a first electrode formed to cover the first surface of the first conductivity type second doping region and the first surface of the second conductivity type second doping region and electrically connecting the first conductivity type second doping region and the second conductivity type second doping region.

The transient voltage suppressor may further include an insulation layer interposed between the first electrode and the first surface of the first conductivity type epitaxial layer and between the first electrode and a first surface of the second conductivity type third doping region.

The transient voltage suppressor may further include a second electrode formed to cover a second surface of the first conductivity type substrate.

The first conductivity type may be a P type and the second conductivity type may be an N type.

As described above, in the transient voltage suppressor and its manufacturing method according to the present invention, voltage withstanding characteristics of a Zener diode can be easily controlled by analogizing growth of a buried layer by forming a portion of the buried layer by performing ion implantation on a first epitaxial layer and then forming the other portion of the buried layer while depositing a second epitaxial layer having the same impurity concentration with the first epitaxial layer.

In addition, in the transient voltage suppressor and its manufacturing method according to the present invention, a current distribution characteristic can be improved by forming a doping region in a ring shape to increase a current pass region by increasing a PN junction area of a Zener diode in a small area.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings in such a manner that the technical idea of the present disclosure may easily be carried out by a person with ordinary skill in the art to which the invention pertains. Objects, operations, effects, other objects, characteristics and advantages of the present disclosure will be easily understood from an explanation of a preferred embodiment that will be described in detail below by reference to the attached drawings.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

Figure 1:
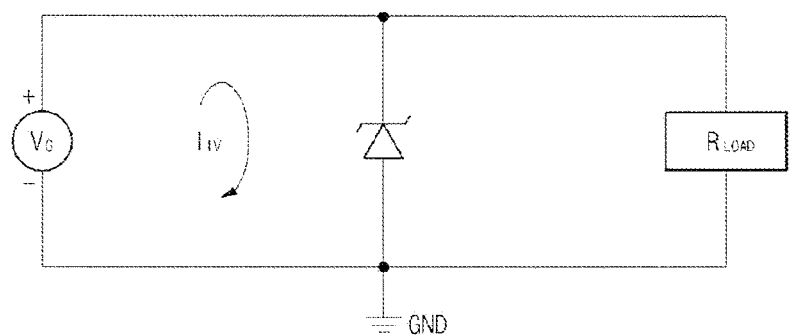
FIG. 1 is a circuit view for explaining the operating principle of a general transient voltage suppressor.
Figure 2:
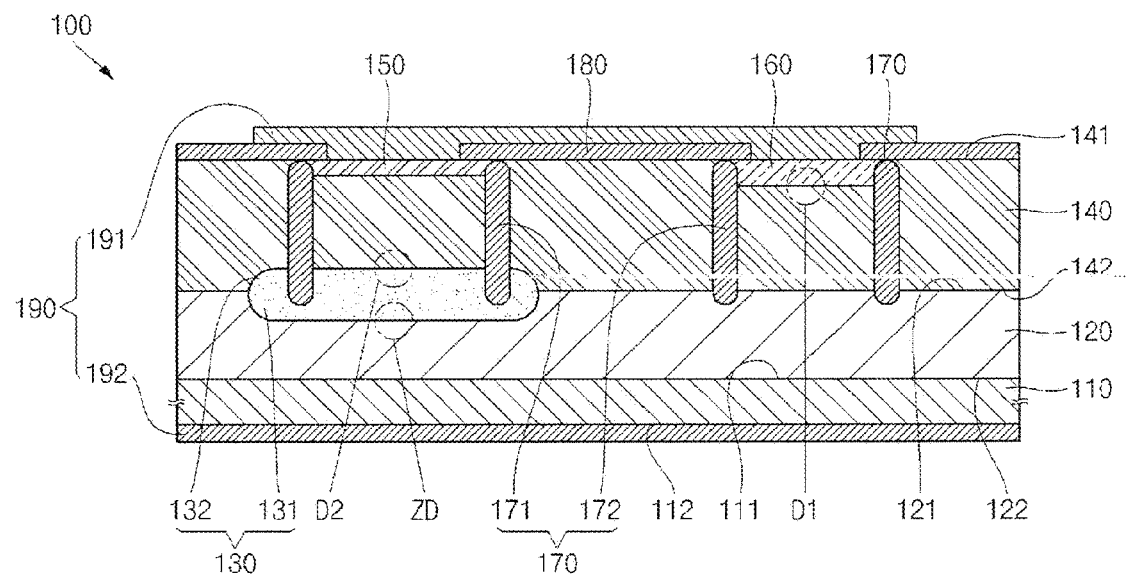
FIG. 2 is a cross-sectional view of a transient voltage suppressor according to an embodiment of the present invention.

Referring to FIG. 2, a cross-sectional view of a transient voltage suppressor according to an embodiment of the present invention is illustrated. As illustrated in FIG. 2, the transient voltage suppressor 100 includes a substrate 110 of a first conductivity type, a first epitaxial layer 120 of a first conductivity type, a buried layer 130 of a second conductivity type, a second epitaxial layer 140 of a first conductivity type, a doping region 150 of a first conductivity type, a doping region 160 of a second conductivity type, an isolation layer 170, an insulation layer 180 and an electrode 190. Hereinafter, a configuration of the transient voltage suppressor 100 will be described together with a manufacturing method of the transient voltage suppressor 100 with reference to FIG. 3.

The first conductivity type substrate 110 shaped of a plate is prepared, the first conductivity type substrate 110 having a first surface 111 and a second surface 112 opposite to the first surface 111 (S1). The first conductivity type substrate 110 may be a high concentration (N+) semiconductor wafer including an N type impurity that is a Group V element, such as arsenic (As), phosphorus (P) or antimony (Sb).

The first conductivity type first epitaxial layer 120 may be deposited on the first surface 111 of the first conductivity type substrate 110 (S2). The first conductivity type first epitaxial layer 120 may be an N type semiconductor layer doped with a low concentration impurity that is a Group V element, such as arsenic (As), phosphorus (P) or antimony (Sb). Here, the low concentration means a relatively low concentration compared to an impurity concentration of the first conductivity type substrate 110. The first conductivity type first epitaxial layer 120 includes a first surface 121 being in contact with the first conductivity type second epitaxial layer 140 and a second surface 122 opposite to the first surface 121 and being in contact with the first surface 111 of the first conductivity type substrate 110.

Figure 4:
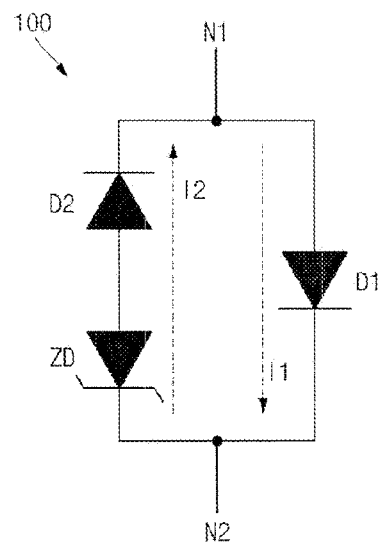
FIG. 4 is an equivalent circuit of the transient voltage suppressor shown in FIG. 2.

The second conductivity type buried layer 130 is interposed between the first conductivity type first epitaxial layer 120 and the first conductivity type second epitaxial layer 140 and may be of a P type, including high concentration impurity (P+) that is a Group III element, such as gallium (Ga), indium (In) or boron (B). The second conductivity type buried layer 130 is formed by forming a bottom portion 131 by implanting a P type impurity inwardly from the first surface 121 of the first conductivity type first epitaxial layer 120 and then allowing a top portion 132 to grow while depositing the first conductivity type second epitaxial layer 140 on the bottom portion 131 (S3). A Zener diode ZD shown in FIG. 4 is implemented by a PN junction of the second conductivity type buried layer 130 and the first conductivity type first epitaxial layer 120. Characteristics of the Zener diode ZD may be controlled by the impurity concentration and growth state of the buried layer 130 formed between the first conductivity type first epitaxial layer 120 and the first conductivity type second epitaxial layer 140.

The first conductivity type second epitaxial layer 140 may be deposited on the first surface 121 of the first conductivity type first epitaxial layer 120 and the second conductivity type buried layer 130 and may be an N type semiconductor layer having an impurity of a Group V element, such as arsenic (As), phosphorus (P) or antimony (Sb), in a low concentration. The first conductivity type second epitaxial layer 140 has a first surface 141 having the first conductivity type doping region 150 and the second conductivity type doping region 160, and a second surface 142 being in contact with the first surface 121 of the first conductivity type first epitaxial layer 120. A second diode D2 shown in FIG. 4 is implemented by a PN junction of the first conductivity type second epitaxial layer 140 and the second conductivity type buried layer 130. The first conductivity type second epitaxial layer 140 and the first conductivity type first epitaxial layer 120 may have the same impurity concentration. That is to say, the second conductivity type buried layer 130 is formed by implanting an impurity into the first conductivity type first epitaxial layer 120 having the same concentration with the second conductivity type buried layer 130 and then depositing the first conductivity type second epitaxial layer 140. Therefore, the second conductivity type buried layer 130 can be easily formed by analogizing its growth and voltage withstanding characteristics of the Zener diode ZD can be easily controlled.

The first conductivity type doping region 150 is inwardly formed from the first surface 141 of the first conductivity type second epitaxial layer 140 corresponding to a region where the second conductivity type buried layer 130 is formed (S4). That is to say, the first conductivity type doping region 150 is inwardly formed from the first surface 141 of the first conductivity type second epitaxial layer 140, and the second conductivity type buried layer 130 is formed from the second surface 142 to the first surface 141 of the first conductivity type second epitaxial layer 140. Here, the first conductivity type second epitaxial layer 140 is interposed between the first conductivity type doping region 150 and the second conductivity type buried layer 130. The first conductivity type doping region 150 may be of an N type region doped with a Group V element, such as arsenic (As), phosphorus (P) or antimony (Sb), as an impurity in a high concentration inwardly from the first surface 141 of the first conductivity type second epitaxial layer 140. Here, the high concentration means a relatively high concentration compared to impurity concentrations of the first conductivity type first epitaxial layer 120 and the first conductivity type second epitaxial layer 140.

The second conductivity type doping region 160 is inwardly formed from the first surface 141 of the first conductivity type second epitaxial layer 140 and is spaced a predetermined distance apart from the first conductivity type doping region 150 (S5). The second conductivity type doping region 160 may be a P type region doped with a Group III element, such as gallium (Ga), indium (In) or boron (B), in a high concentration. Here, the high concentration means a relatively high concentration compared to impurity concentrations of the first conductivity type first epitaxial layer 120 and the first conductivity type second epitaxial layer 140. The first diode D1 shown in FIG. 4 is implemented by a PN junction of the second conductivity type doping region 160 and the first conductivity type second epitaxial layer 140.

The isolation layer 170 includes a first isolation layer 171 and a second isolation layer 172. The first isolation layer 171 is formed on an outer circumferential surface of the first conductivity type doping region 150 and is formed to extend from the second conductivity type buried layer 130 to the first surface 141 of the first conductivity type second epitaxial layer 140. The second isolation layer 172 is formed on an outer circumferential surface of the second conductivity type doping region 160 and is formed to extend from the second surface 142 of the first conductivity type second epitaxial layer 140 to the first surface 141 of the first conductivity type second epitaxial layer 140. That is to say, the first isolation layer 171 and the second isolation layer 172 may be formed to the same height with the first conductivity type second epitaxial layer 140. The isolation layer 170 may be an oxide layer.

The insulation layer 180 is formed on the first surface 141 of the first conductivity type second epitaxial layer 140 to expose the first conductivity type doping region 150 and the second conductivity type doping region 160 to the outside (S6). The insulation layer 180 may include at least one selected from the group consisting of a silicon oxide layer, an oxynitride layer, undoped poly silicon, phosphor silicate glass (PSG), borophosphor silicate glass (BPSG) and equivalents thereof, but the invention does not limit the material of the insulation layer 180 to those listed herein.

The electrode 190 includes a first electrode 191 and a second electrode 192. The first electrode 191 is formed to cover the first conductivity type doping region 150 and the second conductivity type doping region 160, exposed to the outside through the insulation layer 180 and electrically connects the first conductivity type doping region 150 and the second conductivity type doping region 160 (S7). The second electrode 192 is formed on the second surface 112 of the first conductivity type substrate 110. The electrode 190 may be made of one selected from the group consisting of molybdenum (Mo), aluminum (Al), nickel (Ni), gold (Au) and equivalents thereof, but the invention does not limit the material of the electrode 190 to those listed herein.

In the illustrated embodiment, the first conductivity type is an N type and the second conductivity type is a P type, but aspects of the present invention are not limited thereto. The first conductivity type may be a P type and the second conductivity type may be an N type.

Referring to FIG. 4, an equivalent circuit of the transient voltage suppressor shown in FIG. 2 is illustrated.

As illustrated in FIG. 4, the transient voltage suppressor 100 includes a first diode D1, a second diode D2 and a Zener diode ZD. In addition, the transient voltage suppressor 100 includes a first terminal N1 and a second terminal N2. The first terminal N1 and the second terminal N2 may be input and output terminals. That is to say, the first terminal N1 may correspond to the first electrode 191 shown in FIG. 2 and the second terminal N2 may correspond to the second electrode 192 shown in FIG. 2.

The first diode D1 includes an anode electrode and a cathode electrode. The anode electrode of the first diode D1 is connected to the first terminal N1 and the cathode electrode of the first diode D1 is connected to the second terminal N2.

The second diode D2 may also include an anode electrode and a cathode electrode. The anode electrode of the second diode D2 is connected to the anode electrode of the Zener diode ZD and the cathode electrode of the second diode D2 is connected to the first terminal N1.

The Zener diode ZD includes an anode electrode and a cathode electrode. The anode electrode of the Zener diode ZD is connected to the anode electrode of the second diode D2 and the cathode electrode of the Zener diode ZD is connected to the second terminal N2.

That is to say, the second diode D2 and the Zener diode ZD connected to each other in series may be connected to the first diode D1 in parallel.

When a voltage of the first terminal N1 is lower than that of the second terminal N2, the transient voltage suppressor 100 has the first diode D1 through which first current I1 flows. In addition, when a voltage of the first terminal N1 is higher than that of the second terminal N2, the transient voltage suppressor 100 has the second diode D2 through which second current I2 flows. In this case, the second current I2 flows in a forward direction of the second diode D2 and in a reverse direction of the Zener diode ZD. Here, when a reverse voltage applied to the Zener diode ZD by the second current I2 is greater than a breakdown voltage of the Zener diode ZD, current starts to flow in the reverse direction of the Zener diode ZD. Therefore, when an excessive voltage is applied to a load connected between the first terminal N1 and the second terminal N2, the transient voltage suppressor 100 may protect the load by the Zener diode ZD. In addition, capacitance of the transient voltage suppressor 100 can be reduced by the first diode D1 and the second diode D2.

Figure 5:
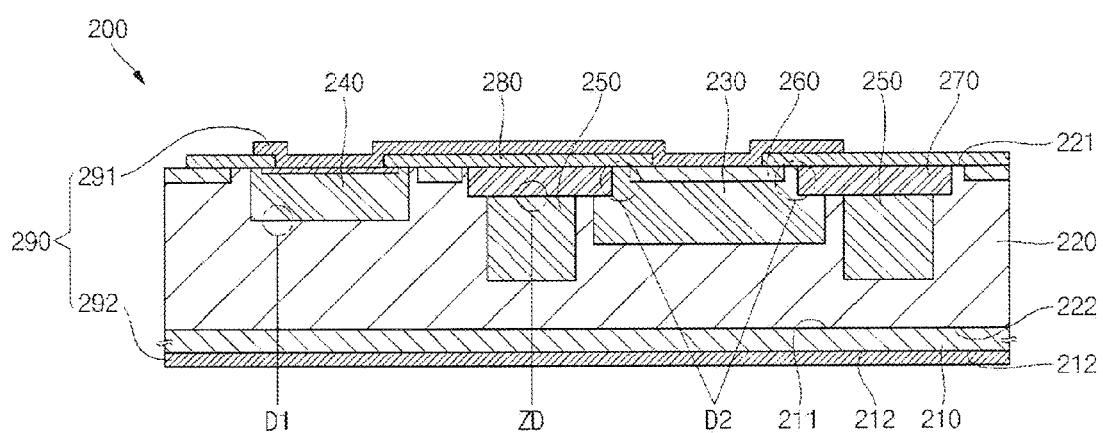
FIG. 5 is a cross-sectional view of a transient voltage suppressor according to another embodiment of the present invention.

Referring to FIG. 5, a cross-sectional view of a transient voltage suppressor according to another embodiment of the present invention is illustrated.

Figure 6:
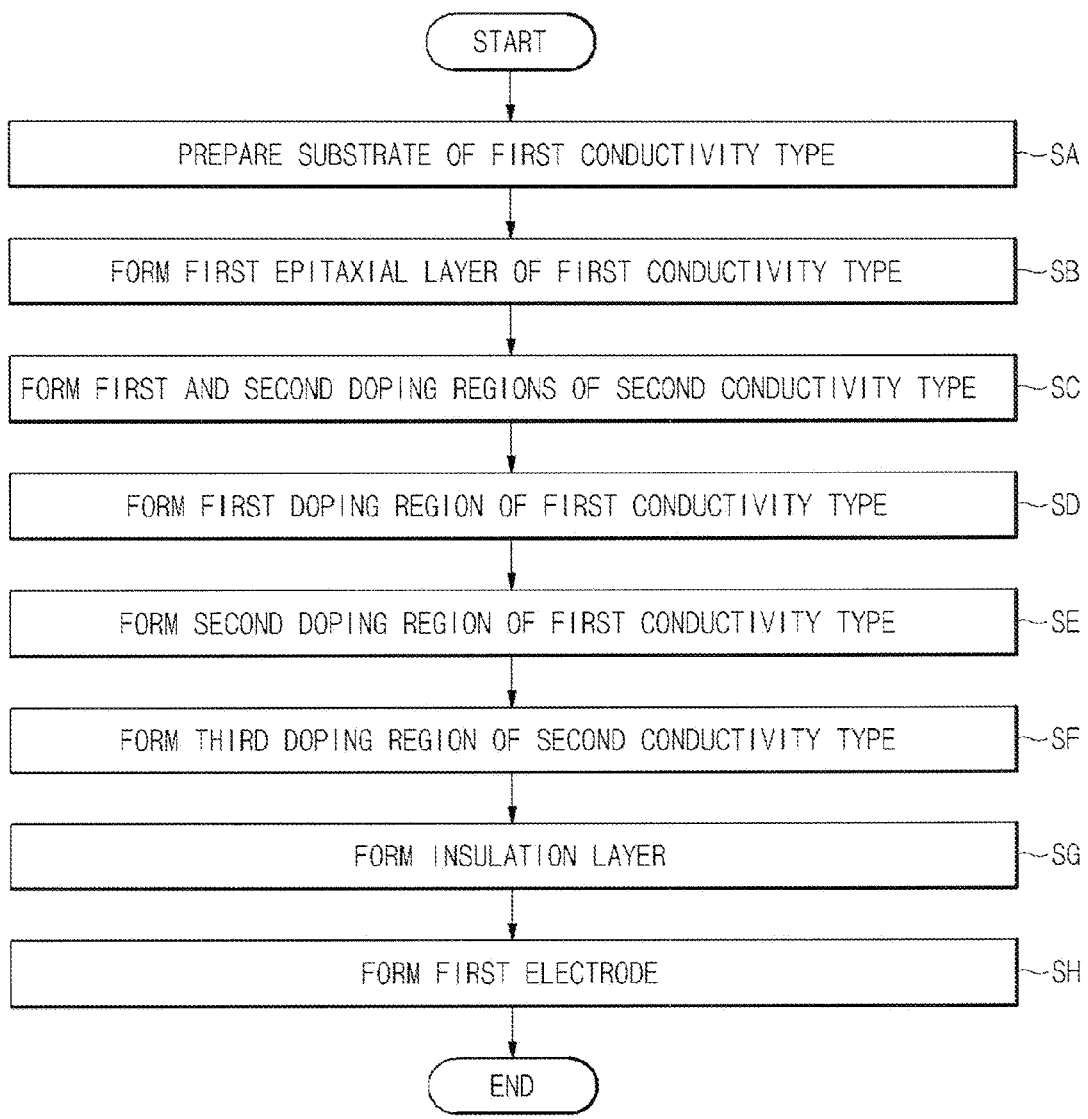
FIG. 6 is a flowchart illustrating a manufacturing method of the transient voltage suppressor shown in FIG. 5.

As illustrated in FIG. 5, the transient voltage suppressor 200 includes a substrate 210 of a first conductivity type, an epitaxial layer 220 of a first conductivity type, a first doping region 230 of a second conductivity type, a second doping region 240 of a second conductivity type, a first doping region 250 of a first conductivity type, a second doping region 260 of a first conductivity type, a third doping region 270 of a second conductivity type, an insulation layer 280, and an electrode 290. Hereinafter, a configuration of the transient voltage suppressor 200 will be described together with a manufacturing method of the transient voltage suppressor 200 with reference to FIG. 6. An equivalent circuit of the transient voltage suppressor 200 is the same with that of the transient voltage suppressor 100 shown in FIG. 4.

The first conductivity type substrate 210 has a roughly plate-like shape and has a first surface 211 and a second surface 212 opposite to the first surface 211 (SA). The first conductivity type substrate 210 may be a high concentration (P+) semiconductor wafer including a P type impurity that is a Group III element, such as gallium (Ga), indium (In) or boron (B).

The first conductivity type epitaxial layer 220 is deposited on the first surface 211 of the first conductivity type substrate 210 (SB) and may be a P type semiconductor layer doped with a low concentration impurity that is a Group III element, that is a Group III element, such as gallium (Ga), indium (In) or boron (B). Here, the low concentration means a relatively low concentration compared to an impurity concentration of the first conductivity type substrate 210. The first conductivity type epitaxial layer 220 includes a first surface 221 on which the second conductivity type first doping region 230, the second conductivity type second doping region 240, the first conductivity type first doping region 250, the first conductivity type second doping region 260 and the second conductivity type third doping region 270 are formed, and a second surface 222 opposite to the first surface 221 and being in contact with the first surface of the first conductivity type substrate 210.

The second conductivity type first doping region 230 is inwardly formed from the first surface 221 of the first conductivity type epitaxial layer 220 (SC). The second conductivity type first doping region 230 may be an N type region doped with a Group V element, such as arsenic (As), phosphorus (P) or antimony (Sb), inwardly from the first surface 221 of the first conductivity type epitaxial layer 220.

The second conductivity type second doping region 240 is inwardly formed from the first surface 221 of the first conductivity type epitaxial layer 220 to be spaced apart from the second conductivity type first doping region 230 (SC). The second conductivity type second doping region 240 may be an N type region doped with a Group V element, such as arsenic (As), phosphorus (P) or antimony (Sb), inwardly from the first surface 221 of the first conductivity type epitaxial layer 220. In addition, the second conductivity type second doping region 240 may be formed together when the second conductivity type first doping region 230 is formed. In addition, the second conductivity type second doping region 240 may have the same doping concentration with the second conductivity type first doping region 230, but aspects of the present invention are not limited thereto. The first diode D1 shown in FIG. 4 is implemented by a PN junction of the second conductivity type second doping region 240 and the first conductivity type epitaxial layer 220.

Figure 7A:
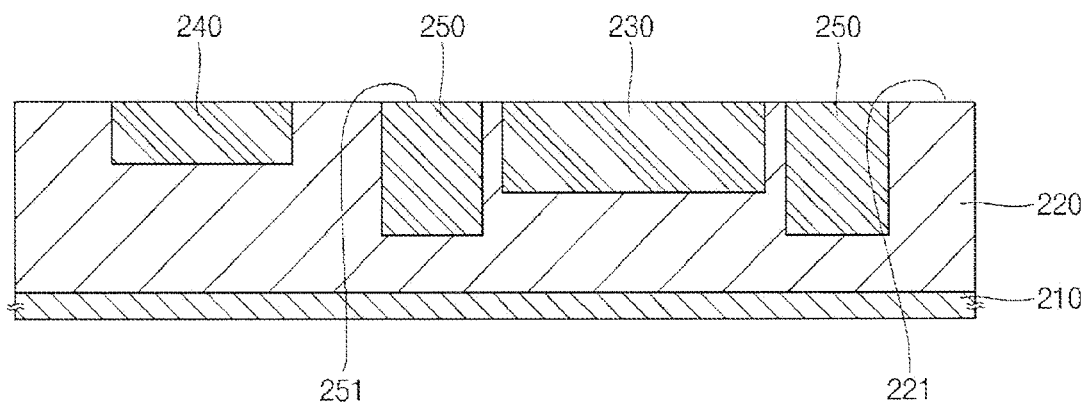
FIGS. 7A to 7D are cross-sectional views and a plan view illustrating the manufacturing method of the transient voltage suppressor shown in FIG. 5.
Figure 7B:
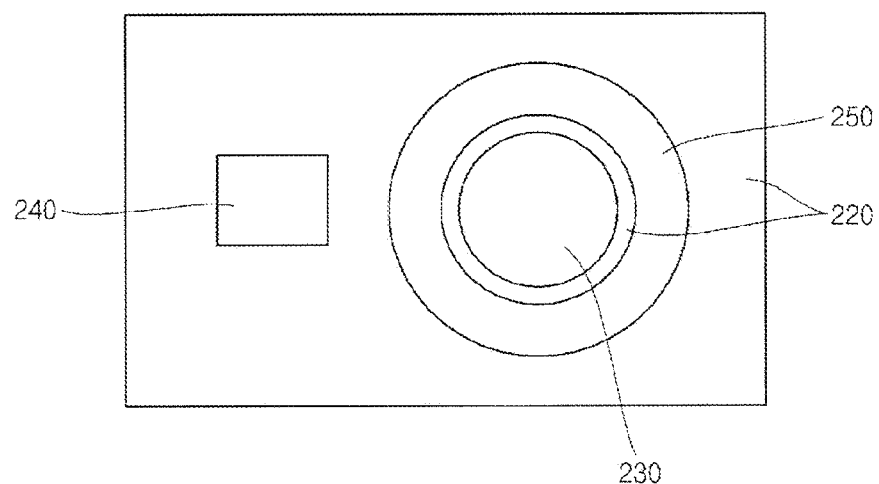

The first conductivity type first doping region 250 is inwardly formed from the first surface 221 of the first conductivity type epitaxial layer 220 to be shaped of a ring surrounding the second conductivity type first doping region 230 (SD). In FIGS. 7A and 7B illustrate a cross-sectional views and a plan view illustrating a manufacturing method of a transient voltage suppressor having the first conductivity type first doping region 250. As shown in FIG. 7B, the first conductivity type first doping region 250 is inwardly formed from the first surface 221 of the first conductivity type epitaxial layer 220 to have a ring-shaped plane surrounding exterior sides of the second conductivity type first doping region 230. In addition, the first conductivity type second doping region 260 is formed to be spaced apart from the second conductivity type second doping region 240. The first conductivity type first doping region 250 may be a P type region doped with a Group III element, such as gallium (Ga), indium (In) or boron (B), in a high concentration. Here, the high concentration means a relatively high concentration compared to an impurity concentration of the first conductivity type epitaxial layer 220.

The first conductivity type second doping region 260 is inwardly formed from a first surface of the second conductivity type first doping region 230 to an interior side of the second conductivity type first doping region 230 (SE). The first conductivity type second doping region 260 may be a P type region doped with a Group III element, such as gallium (Ga), indium (In) or boron (B), in a high concentration. Here, the high concentration means a relatively high concentration compared to an impurity concentration of the first conductivity type epitaxial layer 220. The first conductivity type second doping region 260 may be formed together when the first conductivity type first doping region 250. In addition, the first conductivity type second doping region 260 may have the same impurity concentration with the first conductivity type first doping region 250, but aspects of the present invention are not limited thereto. The first conductivity type second doping region 260 has a smaller depth than the second conductivity type first doping region 230 and is formed inside the second conductivity type first doping region 230.

The second conductivity type third doping region 270 is inwardly formed from the first surface 221 of the first conductivity type epitaxial layer 220, a first surface 251 of the first conductivity type first doping region 250 and a first surface 231 of the second conductivity type first doping region 230 (SF).

Figure 7C:
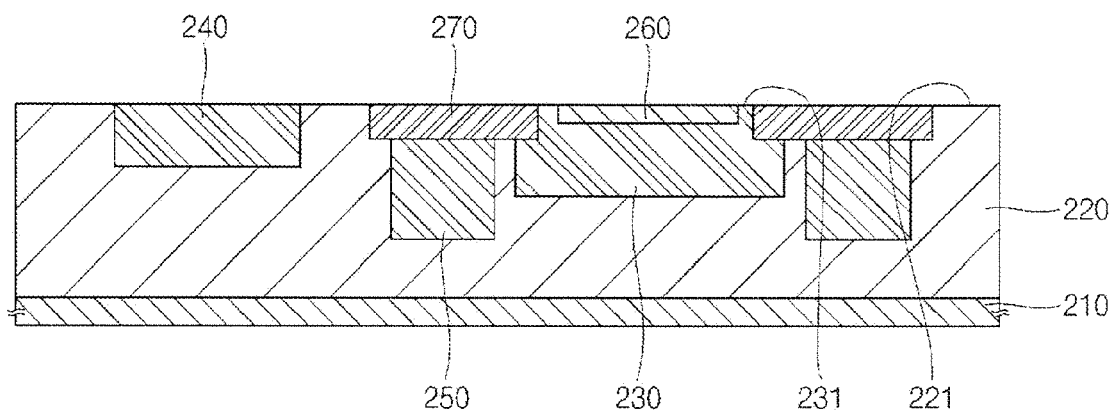
Figure 7D:
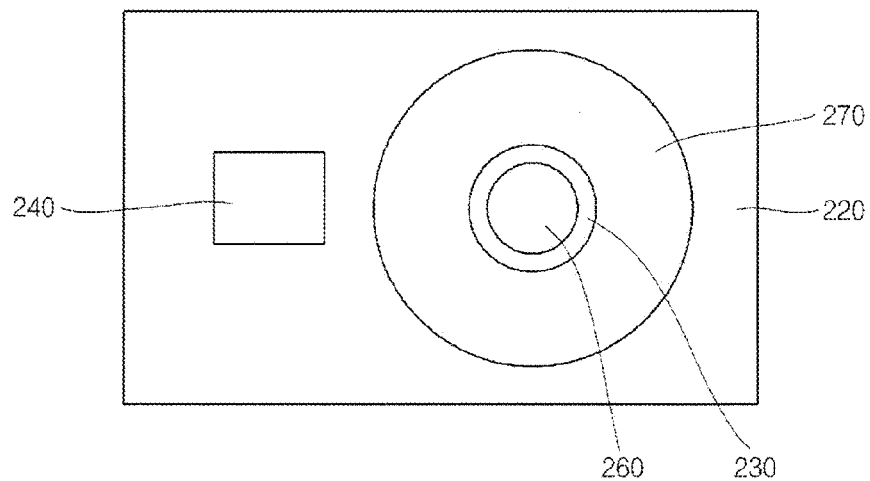

FIGS. 7C to 7D are cross-sectional views and a plan view illustrating the manufacturing method of the transient voltage suppressor having the second conductivity type third doping region (270) are illustrated. As illustrated in FIG. 7D, the second conductivity type third doping region 270 is formed to entirely cover the first surface 251 of the first conductivity type first doping region 250 and has a ring-shaped plane, like the second conductivity type third doping region 270. The second conductivity type third doping region 270 is also inwardly formed from the second conductivity type first doping region 230 spaced apart from the first conductivity type first doping region 250 and electrically connects the second conductivity type first doping region 230 and the first conductivity type first doping region 250. The second conductivity type third doping region 270 has a smaller depth than the second conductivity type first doping region 230 and the first conductivity type first doping region 250. The second conductivity type third doping region 270 may be an N type region doped with a Group V element, such as arsenic (As), phosphorus (P) or antimony (Sb). Here, the high concentration means a relatively high concentration compared to an impurity concentration of the second conductivity type first doping region 230 and the second conductivity type second doping region 240.

Figure 3:
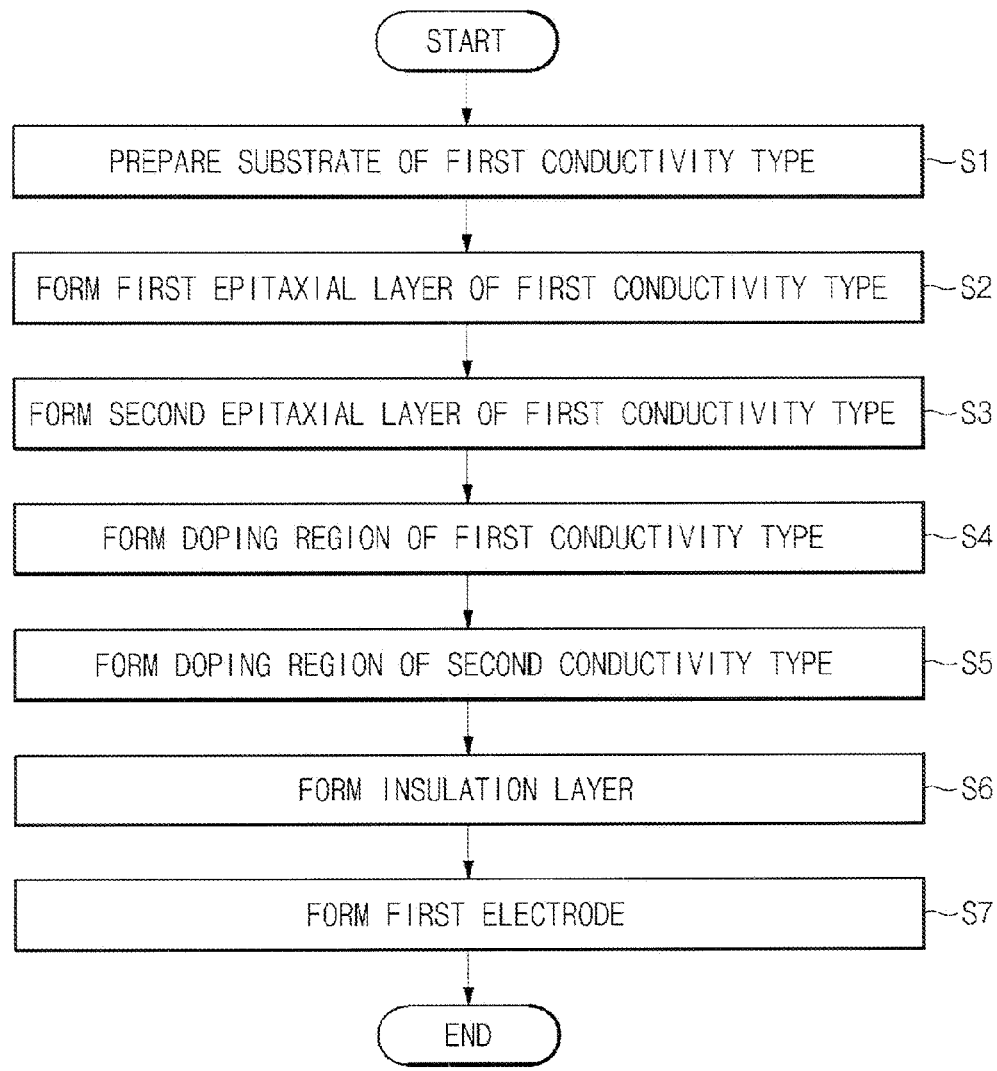
FIG. 3 is a flowchart illustrating a manufacturing method of the transient voltage suppressor shown in FIG. 2.

The Zener diode ZD shown in FIG. 4 is implemented by a PN junction of the second conductivity type third doping region 270 and the first conductivity type first doping region 250. In addition, the second diode D2 shown in FIG. 3 is implemented by a PN junction of the second conductivity type third doping region 270 and the first conductivity type second doping region 260. Here, the second conductivity type first doping region 230 may further be positioned at the PN junction between the second conductivity type third doping region 270 and the first conductivity type second doping region 260.

As described above, since the first conductivity type first doping region 250 and the second conductivity type third doping region 270 are formed to have a ring shape, an area of the PN junction of the Zener diode ZD may be increased within a small area, which increases a current pass region, thereby improving a current distribution characteristic.

The insulation layer 280 is formed on the first surface 221 of the first conductivity type epitaxial layer 220 to expose the first conductivity type second doping region 260 and the second conductivity type second doping region 240 to the outside (SG). Here, the insulation layer 180 is formed to cover a first surface 271 of the second conductivity type third doping region 270. That is to say, the insulation layer 180 is formed on the first conductivity type epitaxial layer 220, specifically doping regions of the first conductivity type epitaxial layer 220 to expose only the first conductivity type second doping region 260 and the second conductivity type second doping region 240. The insulation layer 280 may include at least one selected from the group consisting of a silicon oxide layer, an oxynitride layer, undoped poly silicon, phosphor silicate glass (PSG), borophosphor silicate glass (BPSG) and equivalents thereof, but the invention does not limit the material of the insulation layer 280 to those listed herein.

The electrode 290 includes a first electrode 291 and a second electrode 292. The first electrode 291 is formed to cover the first conductivity type second doping region 260 and the second conductivity type second doping region 240, exposed to the outside through the insulation layer 280 and electrically connects the first conductivity type second doping region 260 and the second conductivity type second doping region 240 (S7). The second electrode 292 is formed on the second surface 212 of the first conductivity type substrate 210. The electrode 290 may be made of one selected from the group consisting of molybdenum (Mo), aluminum (Al), nickel (Ni), gold (Au) and equivalents thereof, but the invention does not limit the material of the electrode 290 to those listed herein.

In the illustrated embodiment, the first conductivity type is a P type and the second conductivity type is an N type, but aspects of the present invention are not limited thereto. The first conductivity type may be an N type and the second conductivity type may be a P type.

Although the transient voltage suppressor and its manufacturing method according to exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A transient voltage suppressor comprising:
   a substrate of a first conductivity type;
   a first epitaxial layer of the first conductivity type, formed on a first surface of the first conductivity type substrate;
   a second epitaxial layer of the first conductivity type, formed on a first surface of the first conductivity type first epitaxial layer;
   a buried layer of a second conductivity type, interposed between the first conductivity type first epitaxial layer and the first conductivity type second epitaxial layer;
   a doping region of the first conductivity type, inwardly formed from a first surface of the first conductivity type second epitaxial layer;
   a doping region of the second conductivity type, inwardly formed from the first surface of the first conductivity type second epitaxial layer and spaced apart from the first conductivity type doping region; and
   a first electrode covering a first surface of the first conductivity type doping region and a first surface of the second conductivity type doping region and electrically connecting the first conductivity type doping region and the second conductivity type doping region,
   wherein the first conductivity type first epitaxial layer and the first conductivity type second epitaxial layer have lower impurity concentrations than impurity concentration of the first conductivity type substrate.

2. The transient voltage suppressor of claim 1, wherein the first conductivity type first epitaxial layer and the first conductivity type second epitaxial layer have same metal doping concentration.

3. The transient voltage suppressor of claim 1, wherein the second conductivity type buried layer is inwardly formed in the first conductivity type first epitaxial layer and the first conductivity type second epitaxial layer from a second surface of the first conductivity type second epitaxial layer in contact with the first surface of the first conductivity type first epitaxial layer.

4. The transient voltage suppressor of claim 1, wherein the second conductivity type buried layer is formed between the first conductivity type first epitaxial layer and the first conductivity type second epitaxial layer is spaced apart from the first conductivity type doping region in a depth direction of the first conductivity type second epitaxial layer.

5. The transient voltage suppressor of claim 1, further comprising a second electrode covering a second surface of the first conductivity type substrate.

6. The transient voltage suppressor of claim 5, wherein the first conductivity type first epitaxial layer and the first conductivity type second epitaxial layer have same metal doping concentration.

7. The transient voltage suppressor of claim 5, wherein the second conductivity type buried layer is inwardly formed in the first conductivity type first epitaxial layer and the first conductivity type second epitaxial layer from a second surface of the first conductivity type second epitaxial layer in contact with the first surface of the first conductivity type first epitaxial layer.

8. The transient voltage suppressor of claim 5, wherein the second conductivity type buried layer is formed between the first conductivity type first epitaxial layer and the first conductivity type second epitaxial layer is spaced apart from the first conductivity type doping region in a depth direction of the first conductivity type second epitaxial layer.

9. The transient voltage suppressor of claim 1, further comprising an insulation layer interposed between the first electrode and the first surface of the first conductivity type second epitaxial layer.

10. The transient voltage suppressor of claim 9, wherein the first conductivity type first epitaxial layer and the first conductivity type second epitaxial layer have same metal doping concentration.

11. The transient voltage suppressor of claim 9, wherein the second conductivity type buried layer is inwardly formed in the first conductivity type first epitaxial layer and the first conductivity type second epitaxial layer from a second surface of the first conductivity type second epitaxial layer in contact with the first surface of the first conductivity type first epitaxial layer.

12. The transient voltage suppressor of claim 9, wherein the second conductivity type buried layer is formed between the first conductivity type first epitaxial layer and the first conductivity type second epitaxial layer is spaced apart from the first conductivity type doping region in a depth direction of the first conductivity type second epitaxial layer.

13. The transient voltage suppressor of claim 1, wherein the first conductivity type is an N type and the second conductivity type is a P type.

14. The transient voltage suppressor of claim 5, wherein the first conductivity type is an N type and the second conductivity type is a P type.

15. A manufacturing method of a transient voltage suppressor, the manufacturing method comprising:
   preparing a substrate of a first conductivity type;
   forming a first epitaxial layer of the first conductivity type on a first surface of the first conductivity type substrate;
   implanting an impurity of a second conductivity type into a portion of a first surface of the first conductivity type first epitaxial layer and then forming a second epitaxial layer of the first conductivity type by growing a buried layer of the second conductivity type by the second conductivity type impurity while growing the first conductivity type second epitaxial layer from the first surface of the first conductivity type first epitaxial layer;
   inwardly forming a doping region of the first conductivity type from the first surface of the first conductivity type second epitaxial layer to the second conductivity type buried layer;
   inwardly forming a doping region of the second conductivity type from the first surface of the first conductivity type second epitaxial layer to be spaced apart from the first conductivity type doping region;
   forming an insulation layer on the first surface of the first conductivity type second epitaxial layer exposing the first conductivity type doping region and the second conductivity type doping region; and forming a first electrode by forming a metal layer covering the exposed first conductivity type doping region and the exposed the second conductivity type doping region.

16. The manufacturing method of claim 15, wherein the first conductivity type first epitaxial layer and the first conductivity type second epitaxial layer have same metal doping concentration.

17. A transient voltage suppressor comprising:
a substrate of a first conductivity type;
an epitaxial layer of the first conductivity type, formed on a first surface of the first conductivity type substrate;
a first doping region of a second conductivity type, inwardly formed from a first surface of the first conductivity type epitaxial layer;
a first doping region of the first conductivity type, inwardly formed from the first surface of the first conductivity type epitaxial layer spaced apart from the second conductivity type first doping region and shaped of a ring surrounding the second conductivity type first doping region;
a second doping region of the first conductivity type, inwardly formed from a first surface of the second conductivity type first doping region;
a second doping region of the second conductivity type, inwardly formed from the first surface of the first conductivity type epitaxial layer spaced apart from the first conductivity type first doping region;
a third doping region of the second conductivity type, inwardly formed from the first surface of the first conductivity type epitaxial layer, the first surface of the first conductivity type first doping region and a first surface of the second conductivity type first doping region and connecting the second conductivity type first doping region and the first conductivity type first doping region; and
a first electrode covering a first surface of the first conductivity type second doping region and the first surface of the second conductivity type second doping region and electrically connecting the first conductivity type second doping region and the second conductivity type second doping region.

18. The transient voltage suppressor of claim 17, further comprising an insulation layer interposed between the first electrode and the first surface of the first conductivity type epitaxial layer and between the first electrode and a first surface of the second conductivity type third doping region.

19. The transient voltage suppressor of claim 17, further comprising a second electrode covering a second surface of the first conductivity type substrate.

20. The transient voltage suppressor of claim 17, wherein the first conductivity type is a P type and the second conductivity type is an N type.

* * * * *